(12) United States Patent
Xie

(10) Patent No.: US 11,355,560 B2
(45) Date of Patent: Jun. 7, 2022

(54) TOUCH DISPLAY PANEL INCLUDING TOUCH UNIT DISPOSED BETWEEN PIXEL DEFINING LAYERS AND/OR BETWEEN PIXEL DEFINING LAYER AND ENCAPSULATION LAYER

(71) Applicant: WUHAN CHINA STAR OPTOELECTRONICS SEMICONDUCTOR DISPLAY TECHNOLOGY CO., LTD., Wuhan (CN)

(72) Inventor: Ming Xie, Wuhan (CN)

( * ) Notice: Subject to any disclaimer, the term of this patent is extended or adjusted under 35 U.S.C. 154(b) by 233 days.

(21) Appl. No.: 16/652,957

(22) PCT Filed: Nov. 14, 2019

(86) PCT No.: PCT/CN2019/118481
§ 371 (c)(1),
(2) Date: Apr. 1, 2020

(87) PCT Pub. No.: WO2021/017315
PCT Pub. Date: Feb. 4, 2021

(65) Prior Publication Data
US 2022/0005876 A1 Jan. 6, 2022

(30) Foreign Application Priority Data
Aug. 1, 2019 (CN) .......................... 201910706031.1

(51) Int. Cl.
*H01L 27/32* (2006.01)
*G06F 3/044* (2006.01)
*H01L 51/52* (2006.01)
*H01L 51/56* (2006.01)
*G06F 3/041* (2006.01)

(52) U.S. Cl.
CPC .......... *H01L 27/323* (2013.01); *G06F 3/0445* (2019.05); *H01L 27/3246* (2013.01); *H01L 51/5234* (2013.01); *H01L 51/56* (2013.01); *G06F 3/0412* (2013.01); *G06F 2203/04102* (2013.01); *H01L 51/5253* (2013.01); *H01L 2227/323* (2013.01); *H01L 2251/5338* (2013.01); *H01L 2251/558* (2013.01)

(58) Field of Classification Search
None
See application file for complete search history.

(56) References Cited

U.S. PATENT DOCUMENTS

| | | | |
|---|---|---|---|
| 2017/0060302 A1 | 3/2017 | Yang et al. | |
| 2018/0039352 A1* | 2/2018 | Wu | G06F 3/044 |
| 2018/0348926 A1 | 12/2018 | Su | |

(Continued)

FOREIGN PATENT DOCUMENTS

| CN | 105094491 A | 11/2015 |
|---|---|---|
| CN | 106887450 A | 6/2017 |

(Continued)

*Primary Examiner* — Nduka E Ojeh

(57) ABSTRACT

The present application provides a touch display panel, because a plurality of touch units is disposed between a first pixel defining layer and a second pixel defining layer, and/or, the plurality of touch units is disposed between the second pixel defining layer and an encapsulation layer, thereby making a thickness of the touch display panel be thinner.

16 Claims, 2 Drawing Sheets

(56) References Cited

U.S. PATENT DOCUMENTS

2019/0012022 A1* 1/2019 Ye ................. G06F 3/04164
2019/0056829 A1* 2/2019 Ye ................. H01L 51/5012
2019/0304818 A1* 10/2019 Ahn ............... H01L 21/67144
2021/0397278 A1* 12/2021 Xie ................ H01L 27/3246

FOREIGN PATENT DOCUMENTS

| CN | 107526468 A | 12/2017 |
| CN | 107704129 A | 2/2018 |

* cited by examiner

TOUCH DISPLAY PANEL INCLUDING TOUCH UNIT DISPOSED BETWEEN PIXEL DEFINING LAYERS AND/OR BETWEEN PIXEL DEFINING LAYER AND ENCAPSULATION LAYER

BACKGROUND OF INVENTION

Field of Invention

The present application relates to the field of display technology, and particularly to a touch display panel.

Description of Prior Art

At present, with the rapid development of display technology, active-matrix organic light-emitting diode display (AMOLED) panels have attracted considerable attention. Active-matrix organic light-emitting diode display panels have gradually been applied to full-screen display devices, bendable display devices, foldable display devices, and flexible display devices. Among them, thinning a thickness of flexible display devices is a future development trend, thin flexible display devices are beneficial to a wide application of flexible display devices, and this improves reliability of flexible display devices.

When active-matrix organic light-emitting diode display panels are applied to flexible display devices, how to reduce the thickness of active-matrix organic light-emitting diode display panels to reduce the thickness of flexible display devices is a problem to be solved.

SUMMARY OF INVENTION

The purpose of this application is to provide a touch display panel, the touch display pane has a thinner thickness.

A touch display panel comprises:

a substrate comprising at least one light emitting region and a non-light emitting region located outside the light emitting region;

an anode disposed upon the substrate and located in the light emitting region;

a first pixel defining layer and a second pixel defining layer, wherein the first pixel defining layer and the second pixel defining layer are sequentially disposed upon the substrate, at least one hole disposed on the anode along a thickness direction of the first pixel defining layer and the second pixel defining layer penetrates the first pixel defining layer and the second pixel defining layer to define the light emitting region of the substrate;

an organic functional layer disposed on the anode and disposed in the hole;

an encapsulation layer disposed on one side of the second pixel defining layer away from the substrate; and a plurality of touch units disposed between the first pixel defining layer and the second pixel defining layer, and/or, the plurality of the touch units disposed between the second pixel defining layer and the encapsulation layer, wherein both the first pixel defining layer and the second pixel defining layer are organic insulating layers.

In the touch display panel, the plurality of the touch units are disposed between the second pixel defining layer and the encapsulation layer, the touch display panel further comprises a first cathode and a second cathode, the first cathode is disposed between the first pixel defining layer and the second pixel defining layer and located in the non-light emitting region, the second cathode is disposed between the organic functional layer and the encapsulation layer and located in the light emitting region, the first cathode and the second cathode are electrically connected to each other by a through hole penetrating in the second pixel defining layer.

In the touch display panel, a sum of thicknesses of the first pixel defining layer and the second pixel defining layer ranges from 1.0 micrometer to 2.0 micrometers.

In the touch display panel, the thickness of the first pixel defining layer is less than the thickness of the second pixel defining layer.

In the touch display panel, a thickness of the first cathode is greater than a thickness of the second cathode.

In the touch display panel, the touch display panel further comprises an antireflection protective layer disposed between the second cathode and the encapsulation layer.

In the touch display panel, the second cathode is made of silver, the antireflection protective layer is made of lithium fluoride.

In the touch display panel, each of the touch units comprises a first electrode and a second electrode, the first electrode and the second electrode constitute a mutual-capacitive touch electrode, the second pixel defining layer comprises a first pixel defining sub layer and a second pixel defining sub layer, the first pixel defining sub layer is disposed between the second pixel defining sub layer and the first pixel defining layer, the first electrode is disposed between the first pixel defining sub layer and the second pixel defining sub layer, the second electrode is disposed between the second pixel defining sub layer and the encapsulation layer.

In the touch display panel, a thickness of the first pixel defining sub layer is greater than a thickness of the second pixel defining sub layer.

A touch display panel comprises:

a substrate comprising at least one light emitting region and a non-light emitting region located outside the light emitting region;

an anode disposed upon the substrate and located in the light emitting region;

a first pixel defining layer and a second pixel defining layer, wherein the first pixel defining layer and the second pixel defining layer are sequentially disposed on the substrate, at least one hole disposed on the anode along a thickness direction of the first pixel defining layer and the second pixel defining layer penetrates the first pixel defining layer and the second pixel defining layer to define the light emitting region of the substrate;

an organic functional layer disposed on the anode and disposed in the hole;

an encapsulation layer disposed on one side of the second pixel defining layer away from the substrate; and a plurality of touch units disposed between the first pixel defining layer and the second pixel defining layer, and/or, the plurality of the touch units disposed between the second pixel defining layer and the encapsulation layer.

In the touch display panel, the plurality of the touch units are disposed between the second pixel defining layer and the encapsulation layer, the touch display panel further comprises a first cathode and a second cathode, the first cathode is disposed between the first pixel defining layer and the second pixel defining layer and located in the non-light emitting region, the second cathode is disposed between the organic functional layer and the encapsulation layer and located in the light emitting region, the first cathode and the second cathode are electrically connected to each other by a through hole penetrating in the second pixel defining layer.

In the touch display panel, a sum of thicknesses of the first pixel defining layer and the second pixel defining layer ranges from 1.0 micrometer to 2.0 micrometers.

In the touch display panel, the thickness of the first pixel defining layer is less than the thickness of the second pixel defining layer.

In the touch display panel, the thickness of the first pixel defining layer is less than the thickness of the second pixel defining layer.

In the touch display panel, the touch display panel further comprises an antireflection protective layer, the antireflection protective layer is disposed between the second cathode and the encapsulation layer.

In the touch display panel, the second cathode is made of silver, the antireflection protective layer is made of lithium fluoride.

In the touch display panel, each of the touch units comprises a first electrode and a second electrode, the first electrode and the second electrode constitute a mutual-capacitive touch electrode, the second pixel defining layer comprises a first pixel defining sub layer and a second pixel defining sub layer, the first pixel defining sub layer is disposed between the second pixel defining sub layer and the first pixel defining layer, the first electrode is disposed between the first pixel defining sub layer and the second pixel defining sub layer, the second electrode is disposed between the second pixel defining sub layer and the encapsulation layer.

In the touch display panel, a thickness of the first pixel defining sub layer is greater than a thickness of the second pixel defining sub layer.

The benefit of the present application is: the present application provides a touch display panel, and because a plurality of touch units are disposed between a first pixel defining layer and a second pixel defining layer, and/or, the plurality of touch units are disposed between the second pixel defining layer and an encapsulation layer, a thickness of the touch display panel becomes thinner, so the touch display panel has a dynamic bending performance, and overall reliable performance of the touch display panel is improved.

10 substrate; 10a light emitting region; 10b non-light emitting region; 11 passivation layer; 12 planarization layer; 13 anode; 141 first pixel defining layer; 142 second pixel defining layer; 14a hole; 1421 first pixel defining sub layer; 1422 second pixel defining sub layer; 15 organic functional layer; 16 encapsulation layer; 17 touch units; 171 first electrode; 172 second electrode; 18 polarizing layer; 19 cover plate; 201 first cathode; 202 second cathode; 21 antireflection protective layer.

DETAILED DESCRIPTION OF PREFERRED EMBODIMENTS

The technical solutions in the embodiments of the present application will be clearly and completely described with reference to the accompanying drawings in the embodiments of the present application. Obviously, the described embodiments are only a part of the embodiments of the present application, not all of the embodiments. The embodiments in the present application, all other embodiments obtained by those skilled in the art without creative labor, all fall within the protection scope of the present application.

Figure 1:
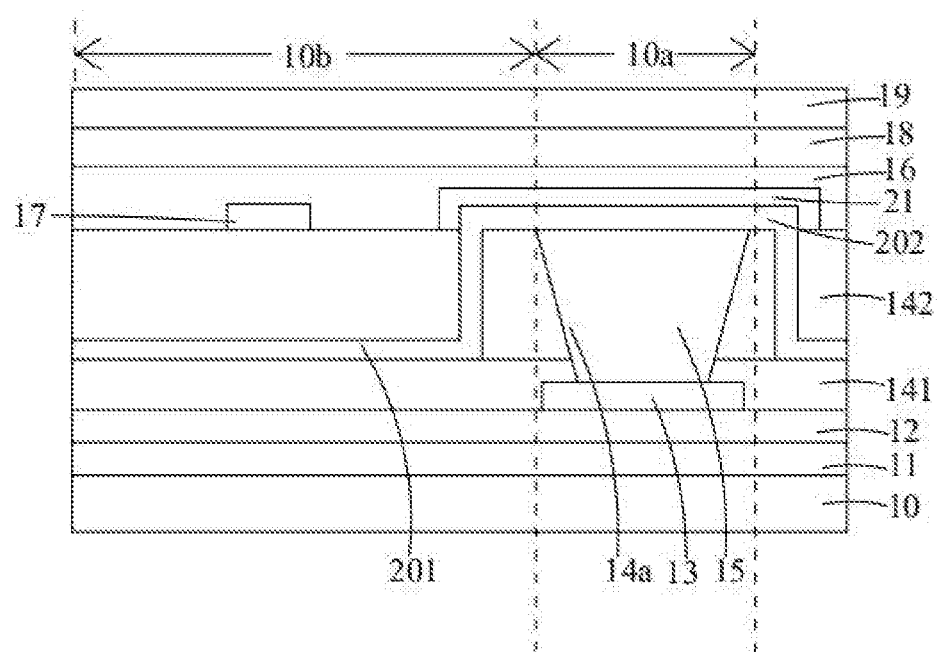
FIG. 1 is a structural schematic diagram of a first embodiment according to the present application.

FIG. 1 is a structural schematic diagram of a first embodiment according to the present application. The touch display panel includes a substrate 10, a passivation layer 11, a planarization layer 12, an anode 13, a first pixel defining layer 141, a second pixel defining layer 142, an organic functional layer 15, an encapsulation layer 16, a plurality of touch units 17, a polarizing layer 18, and a cover plate 19.

The substrate 10 includes a base plate and an array layer of a plurality of thin film transistors in an array set on the base place, that is, the substrate is a thin film transistor array substrate. The thin film transistor layer is used to control a working state of light emitting components. The base plate is a flexible transparent substrate, such as a polyimide substrate. The thin film transistors can be polysilicon thin film transistors, metal oxide thin film transistors, and so on. The substrate 10 includes at least one light emitting region 10a and a non-light emitting region 10b surrounding the light emitting region 10a. The thin film transistors are disposed on the non-light emitting region 10b of the substrate 10.

The passivation layer 11 is formed on a surface of the substrate 10. The passivation layer 11 is used to block ions of the organic layer to prevent the ions from entering into the thin film transistors to affect electrical performance of the thin film transistors. The passivation layer 11 is an inorganic insulating layer. The passivation layer 11 is made of at least one selected from silicon nitride or silicon oxide.

The planarization layer 12 is formed on one side of the passivation layer 11 far away from the substrate 10. The planarization layer 12 is configured to make a surface of the substrate 10 with the formed thin film transistors flatter. A flat surface is good for the light emitting components to be easily formed on the flat surface in a subsequent process. The planarization layer 12 is an organic insulating layer. The planarization layer 12 is made of polyimide, polyacrylate, polypropylene base resin, and so on. A thickness of the planarization layer 12 is 1 micrometer-2 micrometers.

The anode 13 is formed upon the substrate 10 and located in the light emitting region 10a. Specifically, the anode 13 is formed on the planarization layer 12 and located in the light emitting region 10a. The anode 13 is used to output holes to an organic light emitting layer. The anode 13 is an opaque electrode or a translucent electrode. Materials of the anode 13 include but not limited to indium tin oxide, indium zinc oxide, silver, and so on.

The first pixel defining layer 141 and the second pixel defining layer 142 are used to define a light emitting region of the touch display panel. The first pixel defining layer 141 and second pixel defining layer 142 are sequentially disposed upon the substrate 10, and at least one hole 14a disposed on the anode 13 along a thickness direction of the first pixel defining layer 141 and the second pixel defining layer 142 penetrates the first pixel defining layer 141 and the second pixel defining layer 142 to define the light emitting region 10a of the substrate 10.

Specifically, the first pixel defining layer 141 and the second pixel defining layer 142 are sequentially disposed on the planarization layer 12. The hole 14a along the thickness direction of the first pixel defining layer 141 and the second pixel defining layer 142 penetrates through the first pixel defining layer 141 and the second pixel defining layer 142 to define the light emitting region 10a of the substrate 10. A longitudinal section of the hole 14a is inverted trapezoid shaped. Materials of the first pixel defining layer 141 and materials of the second pixel defining layer 142 can be same and can be different. Both the first pixel defining layer 141 and the second pixel defining layer 142 are organic insulating layers. Materials of the first pixel defining layer 141 and materials of the second pixel defining layer 142 can be made of polyimide, polyacrylate, and so on. A value range of a thickness of the first pixel defining layer 141 is 0.2 micrometers-2 micrometers. A value range of a thickness of the second pixel defining layer 142 is 0.2 micrometers-2 micrometers.

The organic functional layer 15 includes an organic light emitting layer. The organic light emitting layer emits visible light to display images. The organic functional layer 15 can further include a hole transmitting layer, a hole injection layer, an electron transmitting layer, an electron injection layer, and so on. The organic functional layer 15 is disposed on the anode 13 and located in the hole 14a.

The encapsulation layer 16 is used to encapsulate the organic functional layer 15 to protect the organic functional layer 15 and to prevent water vapor and oxygen from eroding the organic functional layer 15. The encapsulation layer 16 is disposed on one side of the second pixel defining layer 142 far away from the substrate 10. The encapsulation layer 16 includes two inorganic layers and one organic layer disposed between the two inorganic layers. The inorganic layer is a good barrier to block water vapor and oxygen. The organic layer has good flexibility and can increase a diffusion path of water vapor and oxygen. Therefore, the encapsulation layer 16 can prevent water vapor and oxygen from diffusing to the organic functional layer 15.

The plurality of the touch units 17 are used to receive touch control signals and convert them to electrical signals. The plurality of the touch units 17 are disposed between the first pixel defining layer 141 and the second pixel defining layer 142, and/or, the plurality of the touch units 17 are disposed between the second pixel defining layer 142 and the encapsulation layer 16. Specifically, the plurality of the touch units 17 are disposed between the second pixel defining layer 142 and the encapsulation layer 16. Each of touch units 17 is a self-capacitive touch electrode. It can be understood that the touch units 17 can be disposed between the first pixel defining layer 141 and the second pixel defining layer 142. Compared with a touch layer located outside of the encapsulation layer in prior art, that is an external touch layer, the plurality of the touch units 17 of the present application are disposed between the first pixel defining layer 141 and the second pixel defining layer 142, and/or, the plurality of the touch units 17 are disposed between the second pixel defining layer 142 and the encapsulation layer 16 to make a thickness of the touch display panel thinner, making it possible for the touch display panel to have a dynamic bending performance and improving overall reliable performance of the touch display panel. Compared with the touch units disposed in the encapsulation layer in prior art, the plurality of the touch units 17 of the present application can be formed before the organic functional layer 15 is formed, that is, in a manufacturing process, the plurality of the touch units 17 can be formed at a high temperature, and then the organic functional layer can be formed at a low temperature, thereby facilitating the process, preventing damage to the organic functional layer 15 when preparing the touch units 17 at a high temperature.

The polarizing layer 18 is disposed on one side of the encapsulation layer 16 far away from the substrate 10. The polarizing layer 18 is used to convert natural light into polarized light. The cover plate 19 is a flexible cover plate. The cover plate 19 is used to protect the polarizing layer and other film layers under it. The cover plate 19 can be a flexible polyimide layer.

The touch display panel also includes a first cathode 201 and a second cathode 202. The first cathode 201 is disposed between the first pixel defining layer 141 and the second pixel defining layer 142 and located in the non-light emitting region 10b. The second cathode 202 is disposed between the organic functional layer 15 and the encapsulation layer 16 and located in the light emitting region 10a. The first cathode 201 and the second cathode 202 are electrically connected by a through hole penetrating the second pixel defining layer 142. The second cathode 202 is a transparent electrode to enable light emitted by the organic light emitting layer to emit after being reflected by the anode 13. The second cathode 202 can be made of indium tin oxide, indium zinc oxide, silver, and so on. The first cathode 201 can be made of indium tin oxide, indium zinc oxide, silver, and so on. Compared with the second pixel defining layer 142 formed as an entire surface cathode and the touch units formed under the second pixel defining layer 142, the first cathode 201 is disposed on the first pixel defining layer 141, and the plurality of the touch units are disposed on the second pixel defining layer 142 to prevent the electrical signal interference with the touch units caused by the cathode.

Further, a thickness of the first cathode 201 is greater than a thickness of the second cathode 202 to make light penetrating the second cathode 202 have higher light transmittance, that is, transmittance of the light emitting region 10a is improved, and the thickness of the first cathode 201 is greater to reduce overall resistance of the cathode formed by the first cathode 201 and the second cathode 202 so as to prevent a significant resistance voltage drops in the cathode formed by the first cathode 201 and the second cathode 202, which will cause different luminous brightness in different areas of the touch display panel. In order to improve conductivities of the first cathode 201 and the second cathode 202, both the first cathode 201 and the second cathode 202 are metal layers. A thickness of metal layers is 120 nanometers-150 nanometers. For example, both of them are a nano lever silver layer. The thickness of the second cathode 202 is 170 nanometers, and the thickness of the first cathode 201 is 250 nanometers. The first cathode 201 is a thicker metal to further avoid the problem of resistance voltage drop.

Further, the touch display panel also includes an antireflection protective layer 21. The antireflection protective layer 21 is used to protect the second cathode 202 from the external water vapor and oxygen on the one hand and on the other hand to increase the light transmittance of the light emitted by the organic light emitting layer. The antireflection protective layer 21 is disposed between the second cathode 202 and the encapsulation layer 16. Specifically, when the second cathode 202 is made of silver, the antireflection protective layer 21 is made of lithium fluoride. Because after the second cathode 202 is formed, it takes time to form the encapsulation layer 16, so the antireflection protective layer 21 formed can avoid oxidation or corrosion of the second cathode 202 before forming encapsulation layer 16.

Further, a sum of thicknesses of the first pixel defining layer 141 and the second pixel defining layer 142 ranges from 1.0 micrometer to 2.0 micrometers, that is, the thickness of the first pixel defining layer 141 and the second pixel defining layer 142 are equal to a thickness of a traditional one-layer pixel-defining layer to avoid a great depth of the hole 14a which does not fit the thickness of the organic functional layer 15, to avoid the bulky thickness of the second pixel defining layer 142, which leads to a breakage of wires in the through hole of the second pixel defining layer 142, and to ensure that the touch units are set without increasing the thickness of the pixel defining layer, thereby further reducing the thickness of the touch display panel.

Further, the thickness of the first pixel defining layer 141 is less than the thickness of the second pixel defining layer 142 to make a large distance between the plurality of the touch units 17 and the first cathode 201, to prevent the first cathode 201 from being too close to the plurality of the touch units 17, affecting the electrical performance of touch units 17.

Figure 2:
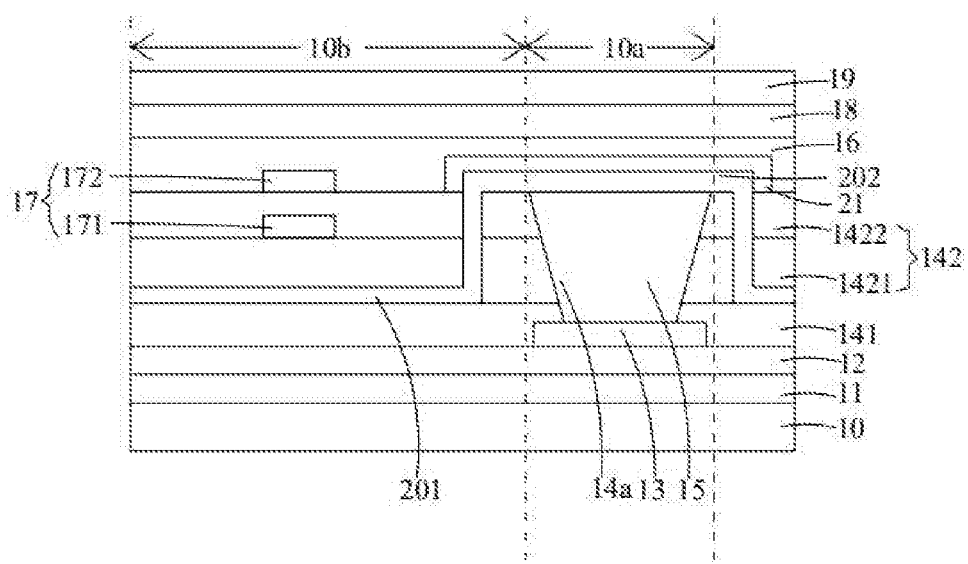
FIG. 2 is a structural schematic diagram of a second embodiment according to the present application.

Referring to FIG. 2, FIG. 2 is a structural schematic diagram of a first embodiment according to the present application. The second pixel defining layer 142 of the touch display panel of FIG. 2 includes a first pixel defining sub layer 1421 and a second pixel defining sub layer 1422. The first pixel defining sub layer 1421 is disposed between the second pixel defining sub layer 1422 and the first pixel defining layer 141. Each of touch units 17 includes a first electrode 171 and a second electrode 172. The first electrode 171 and the second electrode 172 are formed to be a mutual capacitance touch electrode. The first electrode 171 is disposes between the first pixel defining sub layer 1421 and the second pixel defining sub layer 1422. The second electrode 172 is disposed between the second pixel defining sub layer 1422 and the encapsulation layer 16. Other structures of the touch display panel of FIG. 1 are same as other structures of the touch display panel of FIG. 2, which is not described in detail here.

Thicknesses of the first pixel defining sub layer 1421, the second pixel defining sub layer 1422, and the first pixel defining layer 141 can be same. A sum of thicknesses of the first pixel defining sub layer 1421, the second pixel defining sub layer 1422, and the first pixel defining layer 141 ranges from 1 micrometer to 2 micrometers. Further, the thickness of the first pixel defining sub layer 1421 is greater than the thickness of the second pixel defining sub layer 1422 to make a distance between the first electrode 171 and the second electrode 172 less than a distance between the first electrode 171 and the first cathode 201, thereby further preventing the impact of the first cathode 201 on the first electrode 171 and affecting the touch performance of the mutual capacitance touch electrode.

Both the first electrode 171 and the second electrode 172 are metal grids. The first electrode 171 can be a prismatic metal grid arranged in an array, and the second electrode 172 can be a prismatic metal grid arranged in an array. The vertical projection of the prismatic metal grid on the row where the first electrode 171 is located on the substrate 10 and the vertical projection of the prismatic metal grid on the row where the second electrode 172 is located on the substrate 10 are perpendicular to each other. The first electrode 171 can be a metal layer made of titanium/aluminum/titanium. The second electrode 172 can be a layer made of titanium/aluminum/titanium. The first electrode 171 and the second electrode 172 can be made of silver lines or transparent conductive materials.

The present application also provides a manufacturing method of a touch display panel of FIG. 2, which includes steps as follows:

A step S10 of providing a substrate.

Specifically, a thin film transistor array substrate is provided. The thin film transistor array substrate includes a base plate, a thin film transistor array layer, a passivation layer, and a planarization layer. The thin film transistor array layer is disposed on a surface of the base plate. The passivation layer is disposed on a surface of the thin film transistor array layer far away from the base plate. The planarization layer is disposed on a surface of the passivation layer far away from the base plate. A through hole is disposed to penetrate through the planarization layer and the passivation layer and located at a same location of the planarization layer and the passivation layer. The substrate includes at least one light emitting region and a non-light emitting region surrounding the light emitting region. The thin film transistors are disposed in the non-light emitting region of the substrate.

A step S11 of disposing an anode on the planarization layer.

Specifically, a first conducting layer is disposed on an entire surface of the planarization layer, and the first conducting layer is patterned to form the anode by a yellow light process and an etching process. The first conducting layer covers the planarization layer and the through hole of the passivation layer to be electrically connected to a drain electrode of the thin film transistor array layer.

A step S12 of disposing a first pixel defining layer with a first hole on the planarization layer.

Specifically, the first pixel defining layer is formed by a coating process to cover the planarization layer and the anode. The first hole is formed by a yellow light process. The first hole is disposed on the anode to expose a part of the anode to define a light emitting region of the substrate.

A step S13 of disposing a first cathode on the first pixel defining layer.

Specifically, a second conducting layer is formed by a vacuum evaporation process to cover the first pixel defining layer and the anode. A first cathode is formed by a yellow light process and an etching process to remove the second conducting layer in the light emitting region. The first cathode is made of indium tin oxide, indium zinc oxide, silver, and so on. Specifically, the first cathode is a metal layer with a thickness of 120 nanometers-250 nanometers, such as a silver layer with a thickness 250 nanometers. A distance between a boundary of the first cathode close to the first hole and the first hole is 3 micrometer-5 micrometer. The temperature for forming the entire silver layer is 250° C.

A step S14 of disposing a first pixel defining sub layer with a second hole covering the first pixel defining layer and the first cathode.

A first pixel defining sub layer is formed by a coating process to cover the first pixel defining layer, the first cathode and the anode. The second hole is formed by a yellow light process. The second hole is disposed to correspond to the first hole. The second hole communicates with the first hole.

A step S15 of disposing a first electrode on the first pixel defining sub layer.

Specifically, the third conducting layer is formed by a chemical vapor deposition process or a sputtering deposition process, etc. to cover the first pixel defining sub layer and the anode. The third conducting layer is patterned to form the first electrode by a yellow light process or an etching process. The first electrode is a prismatic metal grid. The composition of the first electrode is titanium layer/aluminum layer/titanium layer. A thickness of the titanium layer is 0.05 micrometers, and a thickness of the aluminum layer is 0.6 micrometers. A thickness of the first electrode is 0.7 micrometers. A line width of the first electrode is 3 micrometers.

A step S16 of disposing a second pixel defining sub layer with a third hole to cover the first pixel defining sub layer and the first electrode.

Specifically, the second pixel defining sub layer is formed by a coating process to cover the first pixel defining sub layer, the first electrode, and the anode. The third hole is disposed by a yellow light process. The third hole is disposed to correspond to the second hole. The third hole communicates with the second hole. The first hole, the second hole and the third hole are combined to form a hole. A longitudinal section of the hole is inverted trapezoid shaped.

A step S17 of disposing a second electrode on the second pixel defining sub layer.

Specifically, the fourth conducting layer is formed by a chemical vapor deposition process or a sputtering deposition process, etc. to cover the second pixel defining sub layer and the anode. The fourth conducting layer is patterned to form the second electrode by a yellow light process or an etching process. A composition and a structure of the fourth conducting layer is same as a composition and a structure of the third conducting layer. The second electrode is a prismatic metal grid. The composition of the second electrode is titanium layer/aluminum layer/titanium layer. A thickness of the titanium layer is 0.05 micrometers, and a thickness of the aluminum layer is 0.6 micrometers. A thickness of the first electrode is 0.7 micrometers. A line width of the first electrode is 3 micrometers.

A step S18 of disposing through holes to penetrate through the first pixel defining sub layer and the second pixel defining sub layer and located at two side of the hole.

Specifically, the through holes are disposed by a yellow light process to penetrate through the first pixel defining sub layer and the second pixel defining sub layer and located at two side of the hole.

A step S19 of disposing an organic functional layer on the anode and in the hole.

Specifically, a hole transmitting layer, a hole injection layer, an organic light emitting layer, an electron injection layer, and an electron transmitting layer are formed on the anode and in the hole sequentially.

A step S20 of disposing a second cathode on the organic functional layer and in the through hole penetrating the first pixel defining sub layer and the second pixel defining sub layer.

Specifically, the second cathode is formed on the organic functional layer and in the through hole penetrating the first pixel defining sub layer and the second pixel defining sub layer by a fine mask and a vacuum evaporation process. The second cathode in the through hole is electrically connected to the first cathode. The second cathode is a silver layer with a thickness of 170 nanometers.

A step S21 of disposing an antireflection protective layer on the second cathode.

Specifically, a lithium fluoride is formed on a surface of the second cathode to protect the second cathode and increase transmittance of the light emitting region.

A step S22 of disposing an encapsulation layer to cover the second electrode, the second pixel defining sub layer, and the antireflection protective layer.

A step S23 of disposing a polarizing layer and a cover plate on the encapsulation layer sequentially.

The descriptions of the above embodiments are only used to help understand the technical solutions of this application and their core ideas; those of ordinary skill in the art should understand that they can still modify the technical solutions described in the foregoing embodiments, or some of the technologies Features are equivalently replaced; and these modifications or replacements do not make the essence of the corresponding technical solution out of the scope of the technical solution of the embodiments of the present application.

What is claimed is:

1. A touch display panel, comprising:
    a substrate comprising at least one light emitting region and a non-light emitting region located outside the light emitting region;
    an anode disposed upon the substrate and located in the light emitting region;
    a first pixel defining layer and a second pixel defining layer, wherein the first pixel defining layer and the second pixel defining layer are sequentially disposed upon the substrate, and at least one hole is disposed on the anode along a thickness direction of the first pixel defining layer and the second pixel defining layer and penetrates the first pixel defining layer and the second pixel defining layer to define the light emitting region of the substrate;
    an organic functional layer disposed on the anode and disposed in the hole;
    an encapsulation layer disposed on one side of the second pixel defining layer away from the substrate; and
    a plurality of touch units disposed between the first pixel defining layer and the second pixel defining layer, and/or
    the plurality of the touch units disposed between the second pixel defining layer and the encapsulation layer,
    wherein both the first pixel defining layer and the second pixel defining layer are organic insulating layers; and
    wherein the plurality of the touch units are disposed between the second pixel defining layer and the encapsulation layer, the touch display panel further comprises a first cathode and a second cathode, the first cathode is disposed between the first pixel defining layer and the second pixel defining layer and located in the non-light emitting region, the second cathode is disposed between the organic functional layer and the encapsulation layer and located in the light emitting region, and the first cathode and the second cathode are electrically connected to each other by a through hole penetrating in the second pixel defining layer.

2. The touch display panel of claim 1, wherein a sum of thicknesses of the first pixel defining layer and the second pixel defining layer ranges from 1.0 micrometer to 2.0 micrometers.

3. The touch display panel of claim 2, wherein the thickness of the first pixel defining layer is less than the thickness of the second pixel defining layer.

4. The touch display panel of claim 1, wherein a thickness of the first cathode is greater than a thickness of the second cathode.

5. The touch display panel of claim 4 further comprising an antireflection protective layer disposed between the second cathode and the encapsulation layer.

6. The touch display panel of claim 5, wherein the second cathode is made of silver, and the antireflection protective layer is made of lithium fluoride.

7. The touch display panel of claim 1, wherein each of the touch units comprises a first electrode and a second electrode, the first electrode and the second electrode constitute a mutual-capacitive touch electrode, the second pixel defining layer comprises a first pixel defining sub layer and a second pixel defining sub layer, the first pixel defining sub layer is disposed between the second pixel defining sub layer and the first pixel defining layer, the first electrode is disposed between the first pixel defining sub layer and the second pixel defining sub layer, and the second electrode is disposed between the second pixel defining sub layer and the encapsulation layer.

8. The touch display panel of claim 7, wherein a thickness of the first pixel defining sub layer is greater than a thickness of the second pixel defining sub layer.

9. A touch display panel comprising:
   a substrate comprising at least one light emitting region and a non-light emitting region located outside the light emitting region;
   an anode disposed upon the substrate and located in the light emitting region;
   a first pixel defining layer and a second pixel defining layer, wherein the first pixel defining layer and the second pixel defining layer are sequentially disposed upon the substrate, and at least one hole is disposed on the anode along a thickness direction of the first pixel defining layer and the second pixel defining layer and penetrates the first pixel defining layer and the second pixel defining layer to define the light emitting region of the substrate;
   an organic functional layer disposed on the anode and disposed in the hole;
   an encapsulation layer disposed on one side of the second pixel defining layer away from the substrate; and
   a plurality of touch units disposed between the first pixel defining layer and the second pixel defining layer, and/or
   the plurality of the touch units disposed between the second pixel defining layer and the encapsulation layer,
   wherein the plurality of the touch units are disposed between the second pixel defining layer and the encapsulation layer, the touch display panel further comprises a first cathode and a second cathode, the first cathode is disposed between the first pixel defining layer and the second pixel defining layer and located in the non-light emitting region, the second cathode is disposed between the organic functional layer and the encapsulation layer and located in the light emitting region, and the first cathode and the second cathode are electrically connected to each other by a through hole penetrating in the second pixel defining layer.

10. The touch display panel of claim 9, wherein a sum of thicknesses of the first pixel defining layer and the second pixel defining layer ranges from 1.0 micrometer to 2.0 micrometers.

11. The touch display panel of claim 10, wherein the thickness of the first pixel defining layer is less than the thickness of the second pixel defining layer.

12. The touch display panel of claim 9, wherein a thickness of the first cathode is greater than a thickness of the second cathode.

13. The touch display panel of claim 12 further comprising an antireflection protective layer, wherein the antireflection protective layer is disposed between the second cathode and the encapsulation layer.

14. The touch display panel of claim 13, wherein the second cathode is made of silver, and the antireflection protective layer is made of lithium fluoride.

15. The touch display panel of claim 9, wherein each of the touch units comprises a first electrode and a second electrode, the first electrode and the second electrode constitute a mutual-capacitive touch electrode, the second pixel defining layer comprises a first pixel defining sub layer and a second pixel defining sub layer, the first pixel defining sub layer is disposed between the second pixel defining sub layer and the first pixel defining layer, the first electrode is disposed between the first pixel defining sub layer and the second pixel defining sub layer, and the second electrode is disposed between the second pixel defining sub layer and the encapsulation layer.

16. The touch display panel of claim 15, wherein a thickness of the first pixel defining sub layer is greater than a thickness of the second pixel defining sub layer.

* * * * *